Oct. 7, 1969 A. BILOTTI 3,471,755

DISTRIBUTED VARIABLE ATTENUATOR NETWORK

Filed Aug. 28, 1967

United States Patent Office 3,471,755
Patented Oct. 7, 1969

3,471,755
DISTRIBUTED VARIABLE ATTENUATOR NETWORK

Alberto Bilotti, Williamstown, Mass., assignor to Sprague Electric Company, North Adams, Mass., a corporation of Massachusetts Filed Aug. 28, 1967, Ser. No. 663,806
Int. Cl. H01l 3/00, 11/00; H01c 1/02
U.S. Cl. 317—235 9 Claims

ABSTRACT OF THE DISCLOSURE

In a semiconductor body, a portion having a variable resistance is distributively coupled along a first resistive path of the body so as to provide a variable distributed shunt of the first path.

Background of the invention

The present invention relates to attenuator networks and more particularly to a distributed variable attenuator network.

Variable attenuators are useful in many areas of electronics, for example, for altering the gain of an amplifier or tuning of RC networks etc. These networks often utilize a circuit arrangement of a series resistance in connection to an electrically variable shunting resistance. In some cases, the variable resistance is a transistor which is operated in a variable resistance mode. Bipolar and unijunction transistors are useful in such combinations, however, the insulated gate field effect transistor, or MOS as it is known, is preferable. In any case, however, these prior art circuits are generally limited in both frequency and attenuation, since they utilize lumped elements.

These parameters are enhanced in the novel arrangement of the invention in which a series resistance is combined in a unitized arrangement with a distributed variable resistance shunt. This provides higher attenuation and higher frequency response than in the non-distributed or lumped case. Hence, for the same value of series resistance, variable resistance, and parasitic capacitance the attenuation efficiency of the novel network is enhanced, and moreover, the required chip area which is of increasing importance in microcircuits is reduced.

An object of this invention is to provide a variable attenuator network.

Another object of this invention is to provide a network having variable distributed resistivity.

A further object of this invention is to provide an attenuator network having an electrically controllable distributed resistance.

A still further object of this invention is to integrally combine in a unitized construction a series resistance and a distributed electrically controllable resistance.

These and other objects of the invention will be apparent from the following description and claims taken in conjunction with the drawing.

Summary of the invention

Broadly, a variable attenuator provided in accordance with the invention comprises a body of semiconductive material having a resistive region and a portion of variable resistance. Spaced terminations are provided in connection to the resistive region for providing a first resistive path in the body, and one end of the variable resistance portion is distributively coupled along the first resistive path while its other end is coupled to another terminal of the body so as to provide a second resistive path therein and a variable distributed shunt between the first path and the other termination.

In a more limited sense, the distributed resistance is provided in a semiconductive body by an electrically controllable portion which is spacially distributed in contiguous contact with another resistive region of the body so as to provide a lateral current path distributed along a longitudinal resistive path of the resistive region.

In the preferred embodiment the network is provided by a modified insulated gate field effect transistor in which either the source or drain, or both, are provided with spaced terminations thereby providing a first resistive path longitudinally aligned with and contiguously coupled to one end of the channel of the device. Hence, the electrically variable channel of the MOS unit provides a controllable resistance laterally disposed and distributively coupled to a resistive path of either the source or drain. Both L and H type networks may be provided in this construction. An L type is provided by making the source or drain the first resistive path, and an H type results from utilizing both as resistive paths.

Description of the preferred embodiment

Figure 1:
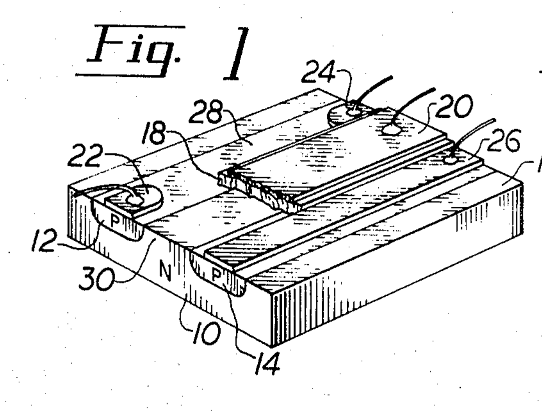
FIGURE 1 is a perspective view of an L type variable attenuator utilizing insulated gate field effect transistor construction in accordance with the invention.

In FIGURE 1, a semiconductive body 10 is shown having a pair of semiconductive regions 12 and 14. These regions which provide source and drain regions of the MOS portion of the structure, are spaced in a substantially parallel relationship adjacent one major surface 16 of the body. An insulative coating 18 and its overlying metallic gate 20 bridges the separation between regions as in a conventional MOS structure. This structure is modified by spaced metallic contacts or terminations 22 and 24 which are in ohmic contact to each end of region 12. Drain region 14 is made an equipotential region by ohmic connection throughout its length to termination 26, and the device is completed by lead wires attached to each of the metallic contacts.

This provides a four terminal structure in which region 12 operates as either a source or drain region and a first resistive path 28 between connections 22 and 24. Hence, resistive path 28 is longitudinally disposed in contiguous contact with one end of the voltage controllable channel 30. Consequently, the channel provides a variable resistance portion and a second resistive path which is distributively coupled at one end along the first resistive path 28 and connected at the other end to the equipotential region 14. Stated otherwise, channel 30 provides a distributed variable shunt between resistive path 28 and termination 26.

In this embodiment, the distributed resistance is made uniform throughout its distributed length by controlling the resistivity and width of the channel during manufacturing. The device is constructed by conventional semiconductor techniques. Body 10 for example is a monocrystalline slice of silicon or the like, having a high conductivity of one conductivity type whereas regions 12 and 14 are zones of high conductivity and the other conductivity type.

The regions may be formed in body 10 by several means, such as by diffusing an appropriate impurity through surface 16. Thereafter an insulative coating such as an oxide of silicon or the like is formed over channel 30, and terminations or contact pads of conductive material, such as aluminum or the like, are then deposited by conventional means, such as vacuum deposition, on appropriate areas. In contrast to the conventional MOS device, however, spaced connections are provided to at least one of the regions. Finally, the unit is completed by attaching leads or other conductors to the terminals by compression bonding or the like. The conventional oxide coating generally provided over all exposed semiconductive surfaces is not shown here for reasons of clarity, however, it should be understood that this practice would normally be employed.

In the preferred embodiment, the body 10 is made of N type material having a conductivity of $10^{16}$ atoms/cm.$^3$ while regions 12 and 14 are P type having a resistivity of 10 ohms/square. This provides a suitable resistance between spaced terminals 22 and 24 and a suitable channel between regions 12 and 14.

Figure 2:
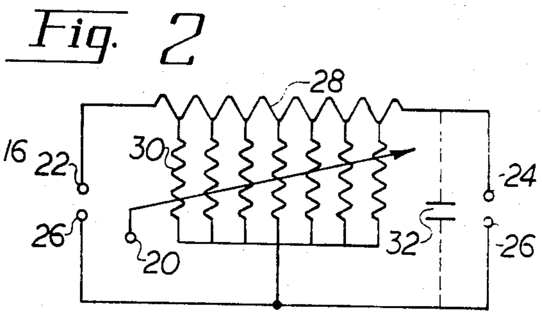
FIGURE 2 is a schematic drawing of the circuit provided by the structure of FIGURE 1.

FIGURE 2 is a schematic circuit of the unitized structure of FIGURE 1 and includes the same numerical designation for like parts. Herein, resistor 28 is shown as a fixed resistance in series between termination 22 and 24 while channel 30 is represented as variable resistance 30 which is distributively coupled between resistance 28 and equipotential terminal 26. This network is symmetrical, and terminals 22 and 26 are chosen for the input while the output is taken from terminals 24 and 26. Finally, gate terminal 20 controls shunting resistance 30. A parasitic capacitance 32, which is inherent in any semiconductive device, is also shown in parallel to resistor 30. However, it should be understood that this capacitance, although not shown as such, is also distributed along with resistor 30 but is not directly controllable in this device.

This structure uniquely combines in one unit the resistive portions of an L type attenuator. This accomplishes a saving of chip area, but, more importantly, gives higher attenuation and higher frequency response than lumped components having the same total series resistance, variable resistance, and parasitic capacitance. This follows from the fact that the variable resistance is distributed along the series resistance and in effect, provides a transmission line having an electrically controllable distributed resistance.

Since the frequency at which the 3DB point will occur in a lumped network of this type is equal to $1/2\pi RC$ and in the distributed case is equal to $2.5/2\pi RC$, the frequency limit of the latter is two and one-half times higher than that of a lumped circuit.

In operation, the FET portion of the structure is run at low signal voltages in its non-saturating or resistive operating region. That is, the FET is operated in its variable resistance mode so that the channel resistance is linearly related to the gate voltage. Consequently, a signal injected in terminal 22 is gradually attenuated as it progresses towards terminal 24 in accordance with the voltage impressed on gate 20.

Figure 3:
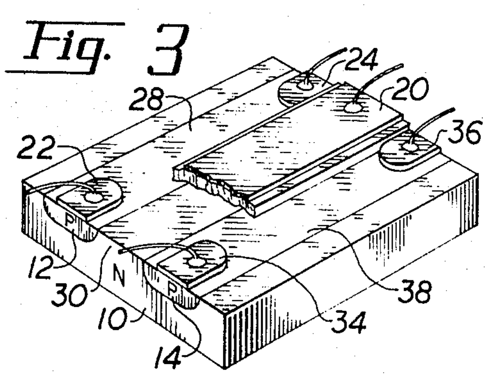
FIGURE 3 is a perspective view of an H type network provided in accordance with the invention.
Figure 4:
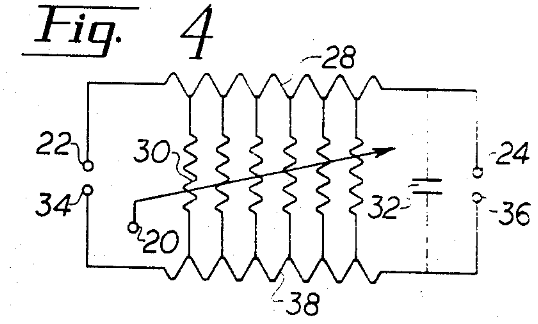
FIGURE 4 is a schematic drawing of the circuit provided by the structure of FIGURE 3.

Advantageously, an H type circuit structure may also be constructed as shown in FIGURE 3. In this case, spaced terminations 34 and 36 replace the equipotential terminal 26 of the L type device and provide a third resistive path 38. This is schematically shown in FIGURE 4 wherein source 12 is again designated by resistor 28, the lateral resistive path of the MOS channel by variable resistor 30, and the drain by fixed resistance 38.

The series resistances of the device may be fixed at any resistance value ranging from a relatively low to a relatively large value depending upon the attenuation desired. It should be realized, however, that if their resistance is reduced to a very low value (approaching an equipotential value) operation of the device would be impaired since the variable resistance while remaining distributed in space would no longer be electrically distributed along the line.

Figure 5:
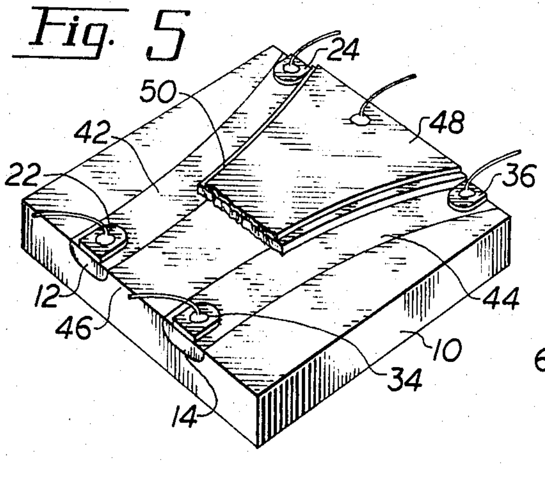
FIGURE 5 is a perspective view of a tapered network.

Many different modifications are possible. For example in the modification illustrated in FIGURE 5, the resistance per unit length of the variable resistance is made non-uniform which provides a tapered network. In this figure, regions 12 and 14 are not disposed in a spaced parallel relationship but diverge so as to provide a non-uniform channel width and consequently, non-uniform or different shunt resistance along the distributed length of line.

As in the previously described H network, region 12 provides a first resistive path 42 between spaced terminations 22 and 24, channel 46 provides the variable resistance, and region 14 provides a third resistive path 44 between terminations 34 and 36. Finally, gate 48, which is insulated from body 10 by oxide coating 50, controls the channel.

As indicated, the distributed resistance of this embodiment is non-uniform. Hence, the network is a tapered line in which the distributed resistance increases from terminations 22 and 34 to terminals 24 and 36. It should be noted that this network is non-symmetrical and will provide different attenuation depending upon the choice of input terminals.

In this embodiment, regions 12 and 14 are curved away from each other to provide the non-uniform width of channel. The latter, however, could also be accomplished by almost any region geometry so long as they are spaced in a non-parallel relationship. The curved regions, however, provide extended resistive paths within a small chip area. This can be utilized with either uniform or non-uniform channels and any meandering region, such as zigzag, triangular and sinusoidal, are useful.

Figure 6:
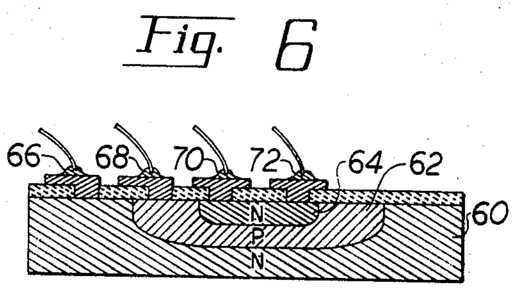
FIGURE 6 is a view in section of an attenuator utilizing bipolar transistor construction.

The concept of utilizing a resistive path disposed in contingous contact throughout its length with one end of a controllable, specially distributed channel can also be applied to unijunction field effect transistors and other types of semiconductors; such as for example, bipolar transistors. This is illustrated in FIGURE 6, wherein a a bipolar transistor having an N type collector 60, a P type base 62, and an N type emitter region 64 which also provides a resistive path, is shown.

A conventional collector terminal 66 and base terminal 68 are provided along with dual emitter terminals 70 and 72. This provides an L type attenuator similar to that of the circuit illustrated in FIGURE 2. Herein, the series resistance is the resistive path between emitter terminals 70 and 72, and the variable resistance is the differential junction resistance. The resistive path of the emitter permits a current flow parallel to the base junctions, that is, the emitter-base and base-collector junction, and with proper forward biasing, the junctions provide a distributed shunt between the first current path and the collector. However, since control of the distributed current path is by current injection into the base region rather than by voltage, this unit is not as useful as the modified field effect structures.

The basic concept may also be utilized with a single junction device such as a diode, but the variable resistance in this case would be less easily controlled since it requires changing of the DC voltage impressed across the junction. Moreover, other embodiments are also possible; for example the series resistance may also be made variable. Additional terminals may also be spaced along the series resistance for wave shaping. Hence, many modifications can be made without departing from the nature and spirit of the invention and it is to be understood that the invention is not to be limited except as set forth in the appended claims.

What is claimed is:

1. A variable attenuator comprising a monocrystalline body of semiconductive material, a resistive region within said body adjacent a surface thereof, said region having spaced apart termination contacts connected thereto and providing a first resistive path in said body, another termination contact in said body laterally spaced from said path, a longitudinal portion of said body having a resistance variable in response to a control electric field, one end of said portion being in contiguous electrical connection along a side of said path and the other end being electrically connected to said another termination contact providing a second resistive path in said body and a variable distributed shunt between said first path and said another termination contact.

2. An attenuator as claimed in claim 1 wherein said region is of opposite conductivity type to that of said body and forms a PN junction therewith, and said junction provides said variable resistance portion.

3. An attenuator as claimed in claim 1 wherein said body comprises a transistor having emitter, base, and collector regions and; said variable resistance portion includes the base region and PN junctions of said transistor structure and said resistive path is disposed in at least one of the other semiconductive regions thereof.

4. An attenuator as claimed in claim 1 wherein said region is a meandering region providing an extended resistive path within a reduced surface area of said body.

5. An attenuator as claimed in claim 1 wherein said variable resistance has a non-uniform length.

6. An attenuator as claimed in claim 1 including a second resistive region having spaced apart termination contacts connected thereto which provide a third resistive path in said body, and said other end of said variable resistance being in contiguous electrical connection along side of said third path such that said variable resistance provides a distributed shunt between said first and third resistive paths.

7. An attenuator as claimed in claim 1 wherein said resistive region is a source or drain region of a field effect transistor and said variable resistive portion is the voltage controllable channel of said transistor.

8. An attenuator as claimed in claim 7 wherein said field effect transistor is an insulated gate type.

9. An attenuator as claimed in claim 7 wherein the width of said channel is non-uniform which provides a change of resistance along its distributed length.

References Cited

UNITED STATES PATENTS

| | | | |
|---|---|---|---|
| 2,648,805 | 8/1953 | Spenke et al. | 317—235 |
| 3,051,840 | 8/1962 | Davis | 250—211 |
| 3,112,230 | 11/1963 | Rudenberg | 136—89 |
| 3,400,383 | 9/1968 | Meadows et al. | 317—234 X |

JAMES D. KALLAM, Primary Examiner

U.S. Cl. X.R.

317—234, 256; 338—320